United States Patent [19]
Caser et al.

[11] Patent Number: 5,844,404
[45] Date of Patent: Dec. 1, 1998

[54] VOLTAGE REGULATOR FOR SEMICONDUCTOR NON-VOLATILE ELECTRICALLY PROGRAMMABLE MEMORY DEVICE

[75] Inventors: Fabio Tassan Caser, Milan; Stefan Schippers, Peschiera Del Garda; Marcello Cane, Piobesi D'Alba, all of Italy

[73] Assignee: SGS-Thomson Microelectronics S.r.l., Agrate Brianza, Italy

[21] Appl. No.: 720,491

[22] Filed: Sep. 30, 1996

[30] Foreign Application Priority Data

Sep. 29, 1995 [EP] European Pat. Off. ............ 95830407

[51] Int. Cl.$^6$ ..................................................... G05F 3/24
[52] U.S. Cl. ............................................. 323/314; 327/530
[58] Field of Search ................................... 323/275, 281, 323/303, 312, 313, 314; 327/530, 545, 546

[56] References Cited

U.S. PATENT DOCUMENTS

| 4,609,833 | 9/1986 | Guterman | 307/297 |
| 4,906,914 | 3/1990 | Ohsawa | 323/314 |
| 5,063,304 | 11/1991 | Iyengar | 307/296.6 |
| 5,382,839 | 1/1995 | Shinohara | 327/545 |
| 5,412,309 | 5/1995 | Ueunten | 323/316 |

FOREIGN PATENT DOCUMENTS

| 0 321 226 | 6/1989 | European Pat. Off. . |
| 0 538 121A1 | 4/1993 | European Pat. Off. . |
| 2 667 169 | 3/1992 | France . |

*Primary Examiner*—Adolf Berhane
*Attorney, Agent, or Firm*—David V. Carlson; Robert E. Mates; Seed and Berry LLP

[57] ABSTRACT

A voltage regulator for electrically programmable non-volatile memory cells includes a gain stage which is supplied a voltage from a voltage booster connected to a supply voltage reference, having an input terminal connected to an output of a voltage divider and an output terminal connected to a pull-up transistor of a pull-up and pull-down differential pair to output the regulated voltage for programming at least one column or bit line of the memory cells. The voltage regulator also includes a second gain stage having an input terminal connected to a second output of the voltage divider. The second stage has an output connected to turn on the pull-down transistor in the complementary pair upon the regulated voltage exceeding a predetermined value.

26 Claims, 3 Drawing Sheets

VOLTAGE REGULATOR FOR SEMICONDUCTOR NON-VOLATILE ELECTRICALLY PROGRAMMABLE MEMORY DEVICE

TECHNICAL FIELD

This invention relates to a voltage regulator for non-volatile storage devices of the electrically programmable semiconductor type.

BACKGROUND OF THE INVENTION

The present invention concerns a voltage regulator which comprises a gain stage being supplied a voltage from a voltage booster connected to a supply voltage reference, and has an input terminal connected to an output of a voltage divider and an output terminal connected to at least one transistor of a pull-up and pull-down differential pair, to thereby output the regulated voltage for programming at least one column or bit line of the memory cells.

As is known, a semiconductor non-volatile storage structure comprises an array of memory cells, each formed of a MOS transistor whose gate electrode, located over its channel region, is a so-called floating gate. This electrode has high DC impedance toward all the other terminals of the same cell and the circuit in which the cell is connected.

The cell further comprises a second electrode, called the control gate electrode, which is driven by means of appropriate control voltages. The other electrodes of the transistor are known as its drain, source and body terminals.

A non-volatile memory integrated on a semiconductor comprises an array of cells arranged into a matrix of rows, called the word lines, and columns, called the bit lines. The cells in one word line have in common the electric line that drives their control gates, whereas the cells in one bit line have their drain terminals in common.

By the application of appropriate voltage values to the cell terminals, the amount of the charge present on the floating gate can be changed, e.g., utilizing phenomena known as Fowler-Nordheim's Tunneling and/or Channel Hot Electron Injection. This results in the transistor being placed in either of two logic states: a first state of "high" threshold voltage, and a second state of "low" voltage threshold.

Since the floating gate has high impedance toward any other terminals of the cell, the stored charge can persist therein for an indefinite length of time, even after the power supply to the circuit which contains it has been cut off. The cell has, therefore, the characteristics of a non-volatile memory.

The operation whereby a charge is stored into the floating gate is called "programming."

The programming of each individual cell is carried out by hot electron injection and results in electrons being trapped in the floating gate, for example, when the control gate is applied approximately 12 volts, with the source terminal being connected to ground and the drain terminal held at a drain voltage of about 5.5 volts.

It is well recognized that non-volatile memory cells, particularly of the FLASH type, require accurate control of the drain voltage applied to the bit line during the programming step. This voltage is, in fact, to satisfy a number of conditions, as listed below:

it should be high enough to allow fast cell programming;
at the same time, it should be sufficiently low to prevent the inception of a phenomenon known as "soft erasing," which consists of the cell becoming partially erased or its characteristics deteriorating in use; and
at all events, it should not trigger on the phenomenon known by the term "parasitic bipolar," for reliability reasons.

The optimum range for the drain voltage is usually a fairly narrow one, being typically of 5 to 6 volts in the given example.

It should be further noted that the above-listed conditions are apt to vary with the fabrication process, specifically with the length of the memory cell. Fabrication processes introduce dimensional variations in the cells, especially in the polysilicon layers, and this affects the value of the drain voltage to be applied.

Due to the above considerations, the storage circuit should be provided with a voltage regulator of a specially refined and precise character, in order to have the bit line supplied with the appropriate drain voltage during the programming step.

The state of the art does provide some solutions directed to fill this demand.

In general, since there basically are two voltages being supplied from external sources to the storage circuit, for example, a supply voltage Vcc of 5 volts and a programming voltage Vpp of 12 volts, the drain voltage is regulated by dividing the programming voltage Vpp.

In this way, a drain voltage can be provided which is relatively stable to temperature and to the parameters of the circuit fabrication process, although it may vary by as much as ±5% with the programming voltage Vpp.

However, since during the programming step, the threshold voltage of the cell tends to become progressively higher, the current draw of the cell is bound to decrease over time. Through the resistive divider, the voltage regulation is effected on the basis of a mean value of the programming current, and a regulation so conceived cannot give good results continually.

A second prior technical solution is described in U.S. Pat. No. 5,263,000, wherein the drain voltage is arranged to be that supplied from a voltage booster being powered by the supply voltage Vcc at 5 volts.

Arranged after the voltage booster is a differential amplifier which drives an output stage comprising a series of two transistors, in the pull-up and pull-down configurations.

Not even the last-mentioned solution is devoid of drawbacks. In particular, an output stage so configured exhibits current consumption of a very high order, presumably because of some current going astray between the voltage booster output and ground.

This can pose some problems at the programming stage because, if the current flowing through the bit line—and hence, the output stage of the regulator—differs from the desired current, then the voltage on the bit line will also be inappropriate, or at least other than the desired one.

Therefore, it is desirable to provide a voltage regulator which can constantly output to the bit line a suitable voltage value to ensure optimum programming of the memory cells, while affording savings in current draw, and therefore, in dissipated power; all this being effective to overcome the limitations of the solutions currently provided by the state of the art.

SUMMARY OF THE INVENTION

According to the present invention, a voltage regulator is provided in which the drain voltage of memory cells is regulated by a single pull-up and utilizing for down-pulling the output stage of the current regulator of the cells, under either steady-state or slow transient phase conditions.

According to one embodiment of the present invention, there is provided a voltage regulator for regulating a boosted voltage relative to a supply voltage from a voltage booster. The regulator includes pull-up and pull-down transistors, a voltage divider and a pair of differential amplifiers. The pull-up transistor receives the boosted voltage and is connected in series with the pull-down transistor. The common node between the two transistors defines an output terminal of the voltage regulator. The voltage divider has two outputs providing two different voltages divided from the supply voltage. The outputs are respectively connected to non-inverting inputs of the two differential amplifiers. The inverting inputs of the two differential amplifiers are connected to the same reference voltage. One of the two amplifiers is powered by the boosted voltage and has an output connected to the control terminal of the pull-up transistor in which the differential amplifier operates to turn off the pull-up transistor when the regulated voltage at the regulator's output terminal rises above a predetermined voltage. The other of the two amplifiers has an output connected to the control terminal of the pull-down transistor in which the differential amplifier operates to turn on the pull-down transistor when the regulated voltage at the regulator's output terminal rises above a certain voltage which is higher than the predetermined voltage.

The features and advantages of the voltage regulating circuit of this invention will be apparent from the following detailed description of an embodiment thereof, to be taken by way of non-limitative example with reference to the accompanying drawings.

DETAILED DESCRIPTION OF THE INVENTION

Figure 1:
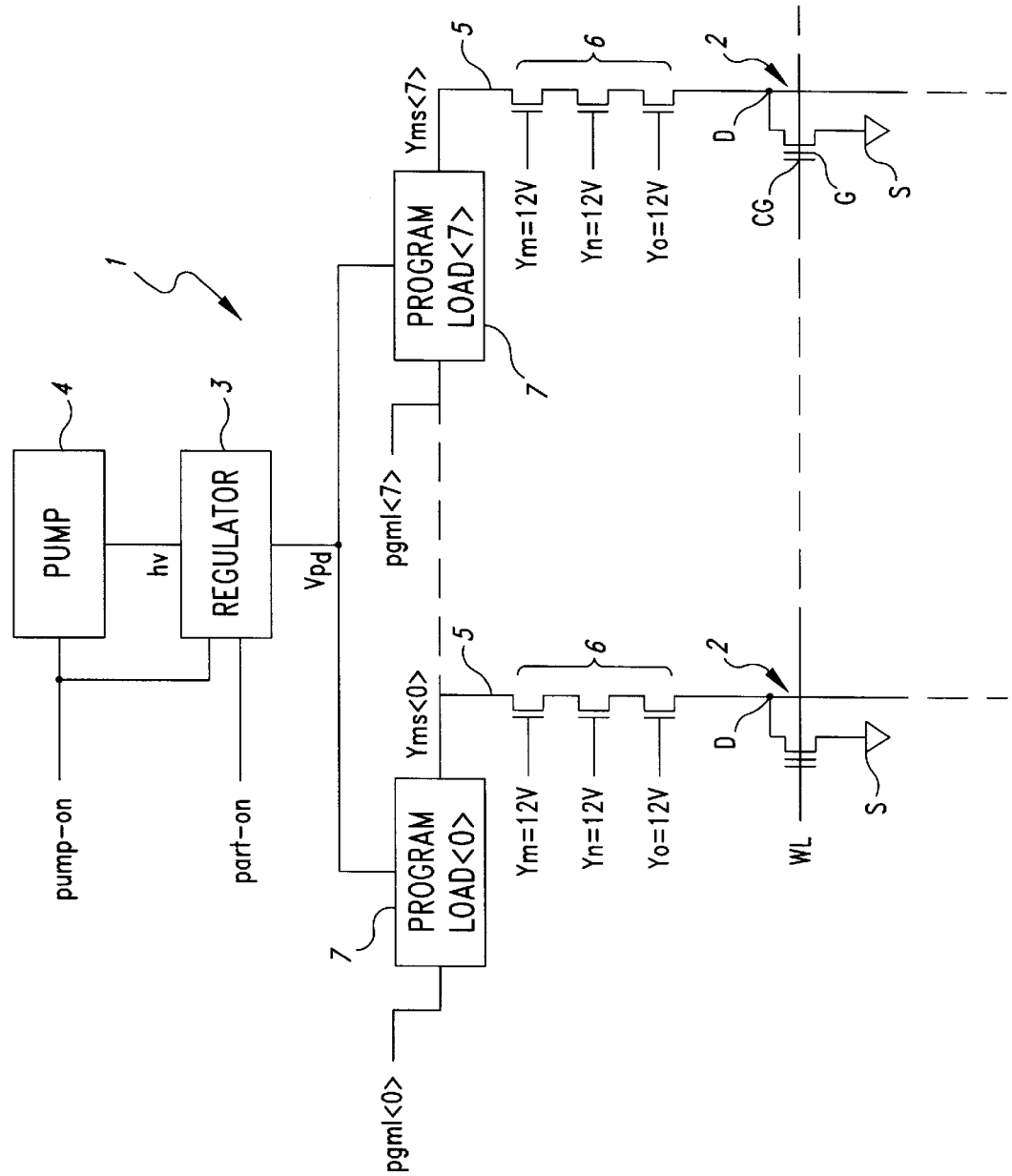
FIG. 1 is a diagrammatic view of a programming circuit which incorporates a voltage regulator according to the invention.

With reference to the drawing views, schematically shown at 1 is a general diagram of a program circuit serving electrically programmable, non-volatile memory cells 2, e.g., cells of the FLASH type.

The circuit 1 includes a voltage regulator 3 according to the invention.

Each cell 2 is formed by a MOS transistor of the floating gate G type which also includes a control gate CG.

The cells 2 are arranged into rows or word lines WL, and columns or bit lines 5. The cells of one word line have in common the electric line that drives their respective control gates CG, while the cells of one bit line 5 have their drain terminals D in common. Shown schematically in FIG. 1, by way of example only, is a matrix of cells having memory words of eight bits.

Connected between the output of the regulator 3 and each bit line 5 is a program-load switch block 7 controlled by a corresponding signal pgml. The blocks 7 receive, as output from the regulator 3, the drain voltage Vpd for application to the bit line 5.

The voltage Vpd will be transferred to an output Yms of each block 7, whenever the corresponding bit requires programming.

The source terminals S of all the cells 2 are connected to a common voltage reference, e.g., a signal ground GND.

Each bit line 5 further comprises a set of MOS transistors, all designated 6, which are connected in series with one another for selection of the bit line to which they belong. These transistors are enabled by column decode signals Yo, Yn and Ym being supplied at 12 volts and applied to respective gate terminals.

The program circuit 1 includes a voltage booster 4, i.e., a charge pumping circuit which is supplied 5 volts from a supply voltage Vcc. The voltage booster 4 can be viewed, for example, as a generator of a voltage hv which is twice (2Vcc) as high as the supply voltage Vcc and has a resistance of preferably 500 ohms connected in series therewith.

The value of the output voltage hv from the voltage booster is, of course, dependent on the supply voltage Vcc and the current supply; the latter is then dependent on the number (0 to 8) of bits to be programmed. Consequently, the output voltage hv from the voltage booster will vary with the parameters it is tied to.

The circuit 1 further includes a voltage regulator 3 intended, in accordance with the invention, for regulating the drain voltage Vpd of the cells during the programming thereof.

Actually, this voltage Vpd would be applied to the bit line 5 but for a negative-going shift in level caused by the write selection transistors 6 provided.

The regulator 3 is controlled by a part-on control signal which is applied to a resistive divider to be described, the voltage booster being controlled by a pump-on control signal.

Figure 2:
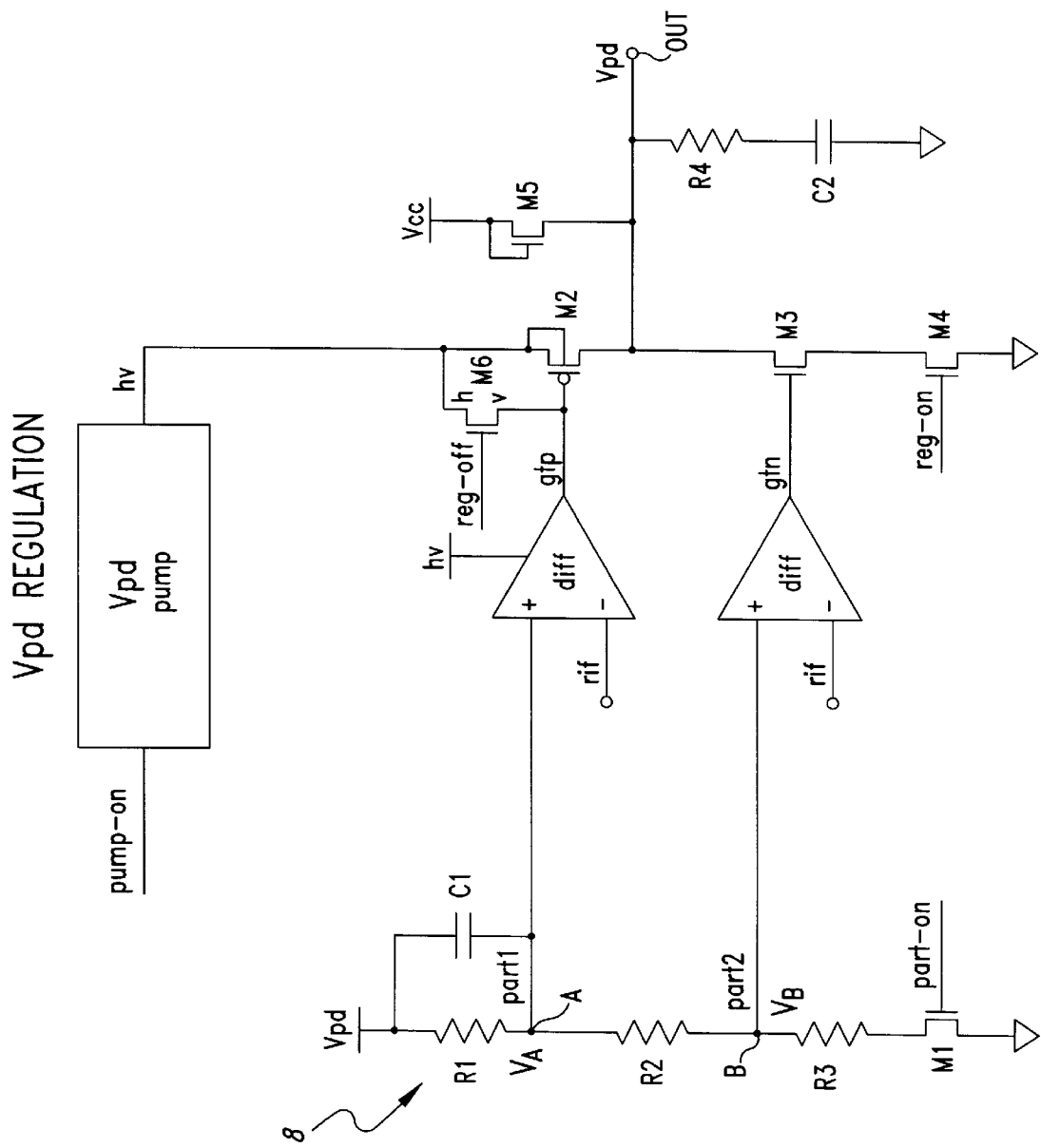
FIG. 2 shows diagrammatically an embodiment of the regulator according to the invention.

The construction of the voltage regulator 3 is shown in detail in FIG. 2, and comprises a resistive divider 8 formed of three resistors R1, R2, R3 connected in series with one another between a voltage reference held at the output drain voltage Vpd and a ground. While the voltage divider 8 is shown as a network of resistors R1–R3, it is intended to include any voltage generator circuit capable of generating a voltage that is proportional to a supply voltage including a generator circuit based on transistors.

Connected between the last series resistor R3 and ground is an enable transistor M1 controlled by the part-on control signal being applied to its gate terminal.

In parallel with the first series resistor R1 is a compensation capacitor C1 which introduces a "zero" into the 0 dB frequency to increase the phase margin for the regulator.

The interconnect point between the first R1 and the second resistor is a first output of the divider, and is represented by a circuit node A. The node A is connected to a non-inverting input of a first differential amplifier diff1 which is supplied a voltage hv from the voltage booster 4.

A second inverting input of the differential amplifier diff1 is held at a reference voltage Vrif which is set at 2 volts by a band-gap voltage regulator, not shown because it is conventional.

The output of the differential amplifier diff1 is connected to the gate terminal of a MOS transistor M2 of the P-channel type which is connected, in series with further transistors M3 and M4, between the output of the voltage booster 4 and ground.

This transistor M2 has its body terminal shorted to its source terminal, the latter being connected to the voltage booster output. Also provided is a transistor M6 having terminals connected between the gate and drain terminals of the transistor M2.

The source terminal of the transistor M2 represents the output OUT of the regulator 3 where the drain voltage value Vpd to be applied to the bit line 5 is taken.

Advantageously, the output OUT of the regulator 3 is latched to the supply voltage Vcc by a transistor M5 in a diode configuration.

In addition, the output OUT is connected to ground through a series of a resistor R4 and a capacitor C2. The RC network including the resistor R4 and capacitor C2 is effective to filter the output terminal OUT, which forms a circuit node weakly charged capacitively.

The interconnect point between the second R2 and the third R3 resistor is a second output of the divider 8, represented by a circuit node B. The node B is connected to a non-inverting input of a second differential amplifier diff2 which, unlike the first, is supplied the supply voltage Vcc of the circuit 1.

A second inverting input of the second differential diff2 is held at the reference voltage Vrif.

The output of the second differential diff2 is connected to the gate terminal of the N-channel MOS transistor M3, which is connected in series between the transistor M2 and the transistor M4 with its drain terminal connected to the source terminal of the transistor M3.

In operation, the differential amplifiers diff1 and diff2 respectively drive a pull-up M2 and a pull-down M3. The first, diff1, of these differential amplifiers is supplied the output voltage hv from the voltage booster in order to turn off the pull-up M2 upon the drain voltage Vpd exceeding 5.5 volts, as will be explained hereinafter.

The operating principle of this invention provides for regulation of the drain voltage Vpd through a single pull-up transistor, substantially utilizing for down-pulling either the current of the memory cells in the steady-state condition or the slow transient phases.

As to the faster transient phases, such as the turn-on of the voltage booster 4 or the turn-off of the program-load switch blocks 7, the second differential amplifier diff2 is effective to prevent overshooting of the drain voltage Vpd by discharging it to ground. This is what would happen, in particular, if the first differential amplifier diff1 were not fast enough to turn off the transistor M2 upon the drain voltage Vpd exceeding 5.5 volts.

For this reason, the resistive divider 8 is dimensioned such that,

Va>Vrif when Vpd>5.5V

Vb>Vrif when Vpd>5.8V

In the former case, the differential amplifier diff1 brings its output to the voltage value of hv, thus turning off the transistor M2, in the latter case, on the other hand, the second differential amplifier diff2 brings its output to the voltage value of Vcc, thereby turning on the transistor M3 and discharging the drain voltage Vpd to ground.

The operation of the voltage regulator 3 of this invention will now be described in detail.

An initial state will be assumed wherein the voltage booster 4 and the regulator 3 are in the off state preliminary to a programming step.

In this situation, the drain voltage Vpd will be held at a value of about 4 volts by the diode M5 bias.

When the programming step is commenced, the resistive divider 8 is activated and the value of the reference voltage Vrif brought to a steady state at 2 volts, already before the voltage booster 4 is fully on. This brings the part-on signal to the same value as the supply Vcc.

In the meantime, the two differential amplifiers diff1 and diff2 will turn on the transistor M2 and hold the transistor M3 in the off state.

In fact, if the transistor M3 were not turned off, the drain voltage Vpd present at the output terminal OUT would discharge toward ground through the transistor M3.

Subsequently, the concurrent turning on of the voltage booster 4 and the regulator 3, upon reception of the pump-on signal, will allow the value of the voltage hv to be raised quite rapidly. Specifically, within approximately 200 ns, the output of the voltage booster 4 will attain twice the value (2Vcc) of the supply voltage and retain that value for as long as the drain voltage Vpd keeps below the limit value of 5.5 volts.

During this high-speed transient phase, if the voltage Vpd exceeds 5.8 volts, both voltage values Va and Vb, as picked up from the outputs A and B of the resistive divider 8, will be higher in value than the reference voltage Vrif Consequently, the transistor M2 will be controlled to the off state by the differential amplifier diff1, whereas the transistor M3 will be turned on by the differential amplifier diff2 to allow the drain voltage Vpd to discharge toward ground.

This situation would persist until the voltage Vpd drops below 5.8 volts.

During the next phase, wherein the voltage Vpd stays at 5.5 to 5.8 volts, both transistors M2 and M3 will be off, and it will be the current flowing through the memory cells 2 that brings the voltage Vpd back toward 5.5 volts, that is, toward the cut-in point of the differential amplifier diff1.

During the initial program transient just described, the current draw by the memory cells 2 is at a maximum.

On termination of this transient, the current draw by the cells 2 will decrease as the cells are being programmed. This causes the cut-in point of the voltage booster 4 to shift toward higher values of the output voltage throughout the duration of the program pulse.

The variations of hv are followed by the first differential amplifier diff1, which will drive the gate terminal of the transistor M2 so as to keep the value of Vpd constant.

The end of the program pulse is given by the program-load blocks 7 being turned off, which removes the voltage Vpd from the drain terminals of the cells.

The break in the connection to the load has no significant effects on the regulation of the voltage Vpd.

The cycle is then completed with the turning off of the voltage booster 4 and the regulator 3.

Figure 3:
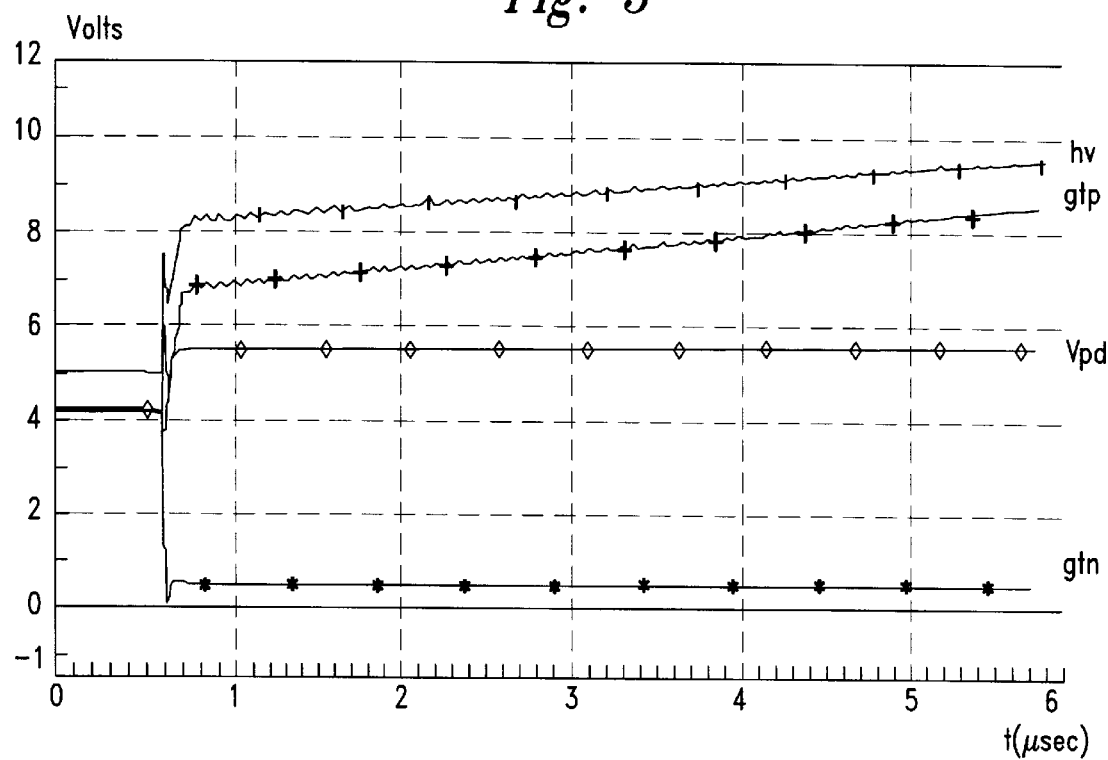
FIGS. 3 and 4 are respective plotting of the characteristic curves of simulations carried out with the regulator according to the invention.
Figure 4:
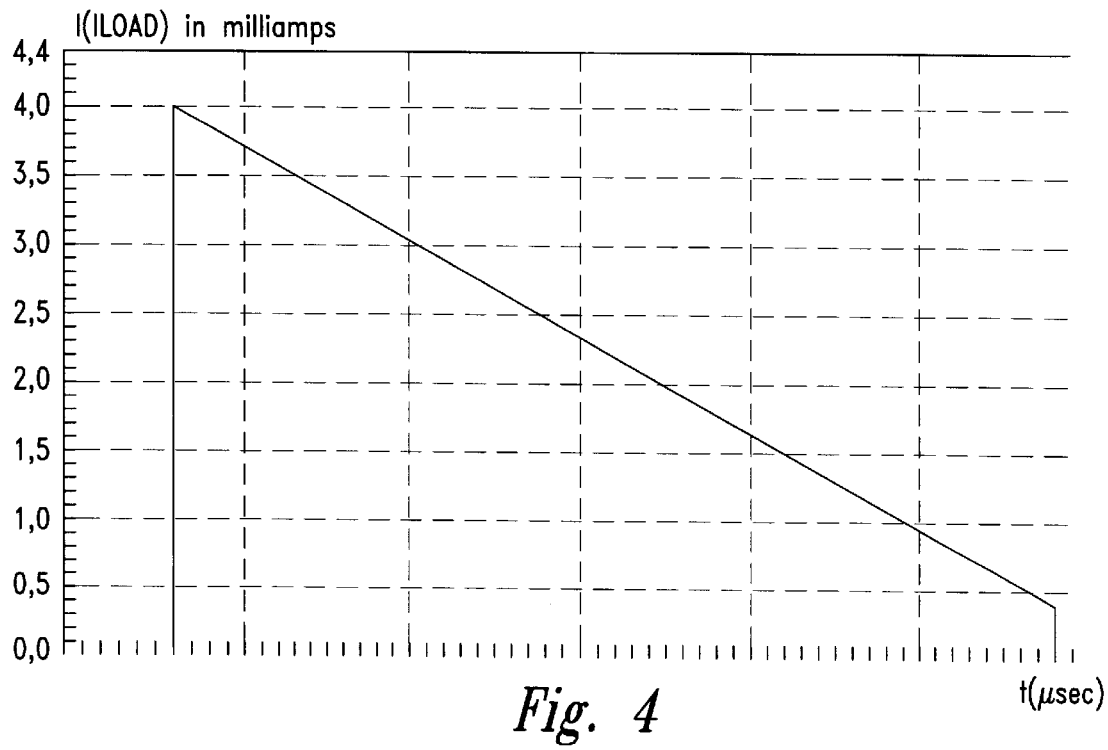

Plotted in FIG. 3 of the accompanying drawings are the results of a simulation carried out by utilizing, instead of the memory cells 2, a current generator load which has a characteristic curve as shown in FIG. 4. FIG. 3 shows voltage levels of various nodes as a function of time in micro-seconds while FIG. 4 shows the current load in milliamps as a function of time in micro-seconds. The time in FIG. 4 is the same as in FIG. 3.

Since the current drawn by the cells 2 is not supplied directly from a power supply, but rather supplied through a voltage booster, the invention has a major advantage in that the pull-down transistor M3 is held normally off.

This means that that transistor will not contribute toward discharging the voltage booster 4.

Another advantage of the invention is that the high-voltage output from the voltage booster 4 is filtered through the P-channel transistor M2, whose gate terminal is driven by the output from the differential amplifier diff1, the latter being powered from the voltage booster 4 itself. In this way, the ripple present on the voltage hv is carried over to both the source terminal and gate terminal of the transistor M2, thereby keeping the gate-source voltage drop virtually constant.

It matters to observe that the two differential amplifiers are comprised of high-voltage transistors, since they are supplied the high-voltage output directly from the voltage booster 4.

However, the second differential which drives the transistor M3 could comprise standard transistors, in view of it being supplied the voltage Vcc directly.

The capacitances incorporated to the circuit 1 are implemented in N-wells, as are the resistors R1, R2 and R3 of the resistive divider. The resistor R4 is formed by a region N+.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A voltage regulator in an integrated non-volatile memory circuit device, comprising:
    a pull-up transistor coupled to a boosted voltage with respect to a supply voltage;
    a pull-down transistor coupled in series with the pull-up transistor, a common node therebetween defining an output terminal of the voltage regulator that provides a regulated voltage;
    a voltage divider coupled between the output terminal of the voltage regulator and a reference ground and having first and second outputs;
    a first gain stage having an input connected to the first output of the voltage divider and an output connected to the pull-up transistor; and
    a second gain stage having an input connected to the second output of the voltage divider and an output connected to the pull-down transistor.

2. The voltage regulator according to claim 1 wherein the first gain stage receives power from the boosted voltage.

3. The voltage regulator according to claim 1 wherein each of the first and second gain stages has a second input receiving a reference voltage.

4. The voltage regulator according to claim 1 wherein the voltage divider includes first, second and third resistors connected in series, a common node between the first and second resistors comprising the first output, and a common node between the second and third resistors comprising the second output.

5. The voltage regulator according to claim 4 wherein the voltage divider further includes a compensation capacitor connected in parallel with the first resistor.

6. The voltage regulator according to claim 1 wherein the output terminal of the voltage regulator is coupled to the supply voltage through an impedance element.

7. The voltage regulator according to claim 1, further comprising an RC circuit connected between the output terminal of the voltage regulator and the reference ground.

8. The voltage regulator according to claim 1, further comprising:
    at least one enabling transistor coupled to the voltage regulator and structured to receive an enabling signal; and
    a voltage booster circuit structured to generate the boosted voltage.

9. In an integrated non-volatile memory circuit device, a voltage regulator for providing a regulated voltage from a boosted voltage relative to a supply voltage, comprising:
    a pull-up transistor coupled to the boosted voltage;
    a pull-down transistor connected in series with the pull-up transistor, a common node therebetween defining an output terminal of the voltage regulator that provides the regulated voltage;
    a voltage divider coupled between the output terminal of the voltage regulator and a reference ground and having first and second outputs;
    a first differential amplifier having an input connected to the first output of the voltage divider and an output connected to the pull-up transistor, the first differential amplifier being operable to turn off the pull-up transistor when the regulated voltage rises above a first voltage; and
    a second differential amplifier having an input connected to the second output of the voltage divider and an output connected to the pull-down transistor, the second differential amplifier being operable to turn on the pull-down transistor when the regulated voltage rises above a second voltage.

10. The voltage regulator according to claim 9 wherein the first differential amplifier receives power from the boosted voltage.

11. The voltage regulator according to claim 9 wherein each of the first and second differential amplifiers has a second input receiving a respective reference voltage.

12. The voltage regulator according to claim 9 wherein the voltage divider includes first, second and third resistors connected in series, a common node between the first and second resistors defining the first output, and a common node between the second and third resistors defining the second output.

13. The voltage regulator according to claim 12 wherein the voltage divider further includes a compensation capacitor connected in parallel with the first resistor.

14. The voltage regulator according to claim 9 wherein the second differential amplifier receives power from the supply voltage.

15. The voltage regulator according to claim 9, further comprising an RC circuit connected between the output terminal of the voltage regulator and the reference ground.

16. The voltage regulator according to claim 9 wherein the second voltage is higher than the first voltage.

17. The voltage regulator according to claim 9, further comprising:
    at least one enabling transistor coupled to the voltage regulator and structured to receive an enabling signal; and
    a voltage booster circuit structured to generate the boosted voltage.

18. A voltage regulator for non-volatile memory cells of an electrically programmable type, comprising a first gain stage which is supplied a boosted voltage from a voltage booster connected to a supply voltage, the first gain stage having an input terminal connected to a first output of a voltage divider and an output terminal connected to at least one transistor of a pull-up and pull-down differential pair of transistors, an output terminal coupled between the pair of transistors providing a regulated voltage for programming at least one bit line of said memory cells, the voltage divider being coupled between the output terminal and a reference ground, and a second gain stage having an input terminal connected to a second output of the voltage divider and an output connected to turn on a second transistor in said complementary pair when the regulated voltage exceeds a predetermined value.

19. The voltage regulator according to claim 18 wherein said one transistor is coupled to the boosted voltage and said second transistor is coupled to the reference ground.

20. The voltage regulator according to claim 18 wherein the first and second gain stages have respective second inputs which are held at an equivalent reference voltage value.

21. The voltage regulator according to claim 18 wherein said voltage divider comprises a series of resistors, of which a first resistor is connected in parallel with a capacitor.

22. The voltage regulator according to claim 18 wherein said second gain stage receives power from said supply voltage.

23. The voltage regulator according to claim 18, further comprising an RC circuit coupled between the output terminal and the reference ground.

24. A method for providing a regulated voltage from a voltage regulator to an electronically programmable, non-volatile memory, comprising:

generating a supply voltage;

generating the regulated voltage at an output terminal of the voltage regulator;

generating a boosted voltage exceeding the supply voltage;

generating first and second reference voltages from the regulated voltage, the first and second reference voltages being less than the regulated voltage;

generating third and fourth reference voltages;

coupling the output terminal to the boosted voltage based on a comparison between the first reference voltage and the third reference voltage; and coupling the output terminal to a reference ground based on a comparison between the second reference voltage and the fourth reference voltage.

25. The method according to claim 24 wherein the act of coupling the output terminal to the boosted voltage comprises:

coupling the boosted voltage to a first terminal of a pull-up transistor;

coupling a second terminal of the pull-up transistor to the output terminal;

comparing the first reference voltage to the third reference voltage in a comparator;

coupling the boosted voltage to the comparator to provide power to the comparator;

generating a control signal at the output of the comparator based on the comparison between the first reference voltage and the third reference voltage;

applying the control signal to a control terminal of the pull-up transistor; and rendering the pull-up transistor conductive when the third reference voltage exceeds the first reference voltage to couple the output terminal to the boosted voltage.

26. The method according to claim 24, further comprising:

filtering the regulated voltage through an RC circuit coupled to the output terminal; and providing enabling signals to one or more enabling transistors coupled to the voltage regulator to enable the voltage regulator.

* * * * *